United States Patent
Badrieh et al.

(10) Patent No.: US 7,166,902 B1
(45) Date of Patent: Jan. 23, 2007

(54) TRENCH-BASED CAPACITOR FOR INTEGRATED CIRCUITS

(75) Inventors: Fuad Badrieh, Santa Clara, CA (US);
Feng Dai, San Jose, CA (US); Bartosz Banachowicz, Santa Clara, CA (US);
Roger J. Bettman, Los Altos, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/988,812

(22) Filed: Nov. 15, 2004

Related U.S. Application Data

(60) Provisional application No. 60/520,858, filed on Nov. 18, 2003.

(51) Int. Cl.
*H01L 21/425* (2006.01)

(52) U.S. Cl. ................. 257/532; 257/303; 257/534; 257/535

(58) Field of Classification Search ................ 257/532, 257/534, 535, 303
See application file for complete search history.

(56) References Cited

U.S. PATENT DOCUMENTS

| | | | |
|---|---|---|---|
| 6,559,493 B1 * | 5/2003 | Lee et al. ................. 257/301 |
| 2002/0185707 A1 * | 12/2002 | Ishii ............................ 257/532 |
| 2003/0001188 A1 * | 1/2003 | Nakagawa .................. 257/303 |
| 2004/0036143 A1 * | 2/2004 | Hu et al. ..................... 257/534 |
| 2004/0232520 A1 * | 11/2004 | Tsau ........................... 257/532 |

* cited by examiner

*Primary Examiner*—Jerome Jackson
(74) *Attorney, Agent, or Firm*—Okamoto & Benedicto LLP

(57) ABSTRACT

In one embodiment, an electrically conductive trench in an integrated circuit allows for the formation of capacitors between the trench and other portions of the integrated circuit. For example, a capacitor may be formed between the trench and an electrically conductive line. Among other advantages, the capacitor provides a relatively large capacitance while occupying a relatively small area.

10 Claims, 13 Drawing Sheets

TRENCH-BASED CAPACITOR FOR INTEGRATED CIRCUITS

REFERENCE TO RELATED APPLICATION

This application claims the benefit of U.S. application Ser. No. 60/520,858, entitled "Trench-based Capacitor For Integrated Circuits," filed on Nov. 18, 2003 by Fuad Badrieh, Feng Dai, Bartosz Banachowicz, and Roger Bettman, which is incorporated herein by reference in its entirety.

BACKGROUND OF THE INVENTION

1. Field of the Invention

The present invention relates generally to integrated circuits, and more particularly but not exclusively to integrated circuit fabrication processes and structures.

2. Description of the Background Art

Capacitors are employed in a variety of integrated circuits, including those that include phase lock loops. Unlike discrete capacitors, capacitors formed in integrated circuits are preferably small to leave more room for transistors and other active components. That is, to conserve die space, it is advantageous to have an integrated capacitor that has relatively large capacitance per unit area.

Various types of capacitors, such as parallel plate, back-end interdigitated, and MOS gate capacitors, have been employed in integrated circuits. However, these capacitors typically require a relatively large area and, depending on the process, additional layers and processing steps. Some of these capacitors are also voltage-dependent, making them unsuitable in applications requiring tight control of capacitance values.

SUMMARY

In one embodiment, an electrically conductive trench in an integrated circuit allows for the formation of capacitors between the trench and other portions of the integrated circuit. For example, a capacitor may be formed between the trench and an electrically conductive line. Among other advantages, the capacitor provides a relatively large capacitance while occupying a relatively small area.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided, such as examples of materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
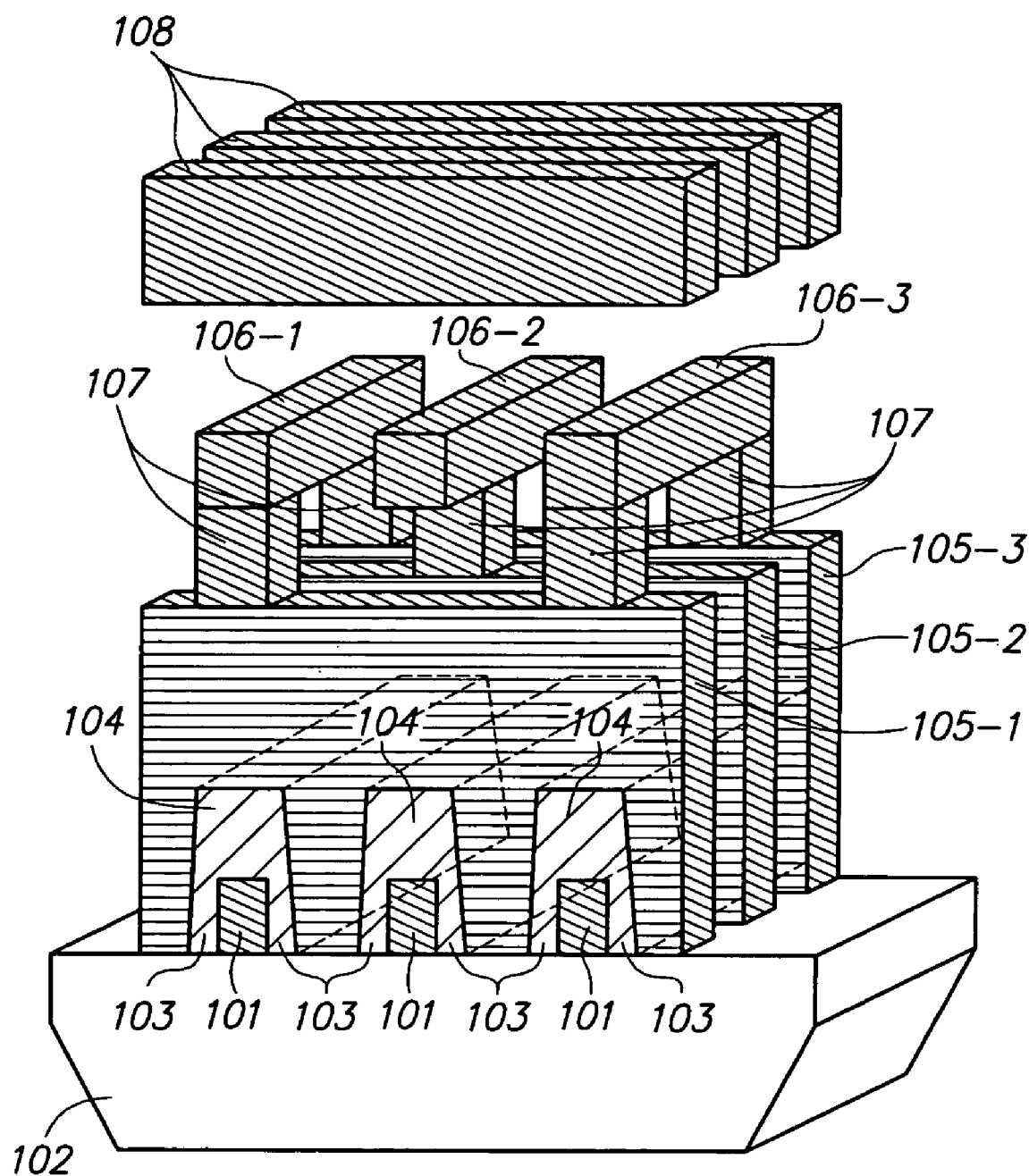
FIG. 1 schematically shows an integrated circuit structure in accordance with an embodiment of the present invention.

FIG. 1 schematically shows an integrated circuit structure in accordance with an embodiment of the present invention. In the example of FIG. 1, electrically conductive lines 101 comprise doped polysilicon and are formed over an isolation structure 102 (e.g., field oxide). Spacers 103 comprising silicon nitride may be formed on the sidewalls of the polysilicon lines 101. A silicon nitride layer ("gate nitride") 104 is formed over each polysilicon line 101. In one embodiment, the width of a spacer 103 on a side of a polysilicon line 101 is about 400 Angstroms, while the thickness of a gate nitride 104 above a polysilicon line 101 is about 1200 Angstroms. Compared to other dielectrics, a high dielectric constant material, such as silicon nitride, in this application advantageously allows for larger capacitance per the same unit area.

Formed over the polysilicon lines 101 are local interconnect trench ("LITR") structures 105 (i.e., 105-1, 105-2, . . . ). LITR structures 105 comprise an electrically conductive material, such as tungsten. LTIR structures 105 effectively "wrap" around polysilicon lines 101. This and the relatively thin layers of high dielectric constant material between LITR structures 105 and polysilicon lines 101 advantageously result in large (e.g., about 1.65 fF/$\mu m^2$ to 2.6 fF/$\mu m^2$) and tighter capacitance values. Also, LITR structures 105 combined with features with relatively small dimensions (e.g., about 0.12 $\mu m$) in the local interconnect level allow for relatively large value capacitance. In one embodiment, an LITR structure 105 is about 5000 Angstroms thick as measured from the top of LITR structure 105 contacting DDLICON lines 107 (discussed further below) to the bottom of the LITR structure 105 contacting the substrate (see substrate 801 in FIG. 8).

As their name implies, dual-damascene local interconnect lines ("DDLI") 106 (i.e., 106-1, 106-2, . . . ) are formed using a dual-damascene process over the LITR structures 105. The dual damascene process advantageously prevents formation of air gaps (i.e., voids), thus increasing capacitance. DDLI lines 106 may comprise an electrically conductive material, such as tungsten. DDLI lines 106 are electrically connected to LITR structures 105 by way of electrically conductive lines referred to as DDLI connection ("DDLICON") lines 107.

In the example of FIG. 1, first metal level interconnect ("M1") lines 108 are formed over the DDLI lines 106. Electrically conductive metal connections ("mcons") between M1 lines 108 and DDLI lines 106 are not shown for clarity of illustration. In practice, the mcons may be formed outside capacitor unit blocks. The mcons may be formed at the edge or periphery of a capacitor in a straping area. M1 lines 108 are on the first metal level of the integrated circuit structure. Features below the first metal level, such as polysilicon lines 101, are in a local interconnect level. In the example of FIG. 1, spaces that are not filled-in comprise dielectric materials. For example, the spaces between LITR structures 105 may be filled with phosphorous silica glass (PSG). As another example, the spaces between the DDLI lines 106 and the LITR structures 105 and between the M1 lines 108 and the DDLI lines 106 may be filled with silicon dioxide.

Figure 2:
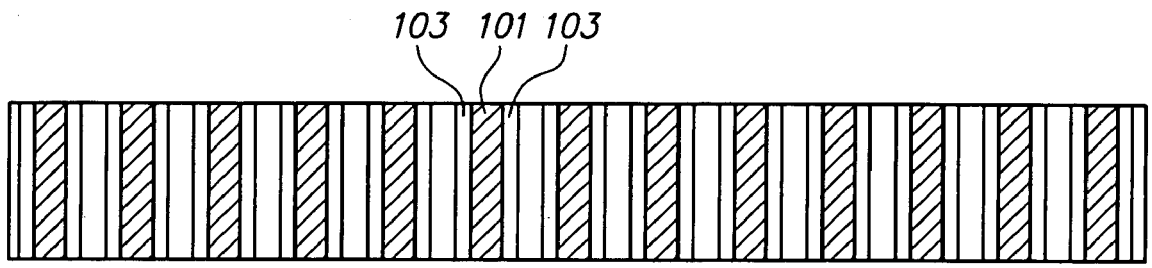
FIGS. 2–7 schematically show sectional top views of the integrated circuit structure of FIG. 1.
Figure 3:
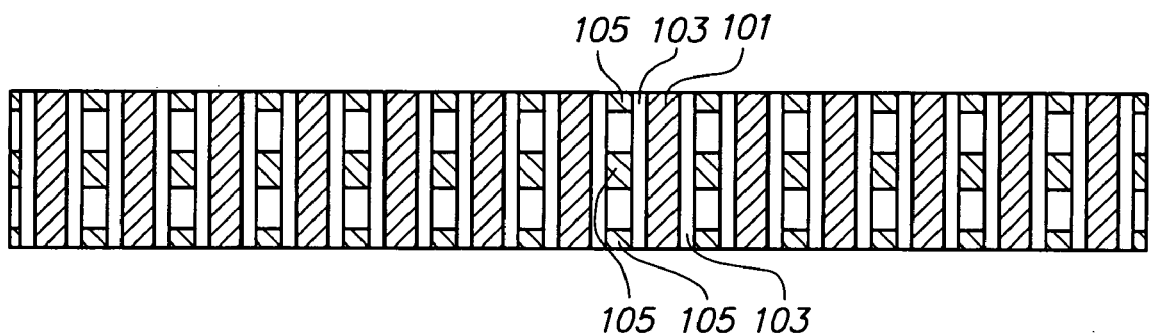
Figure 4:
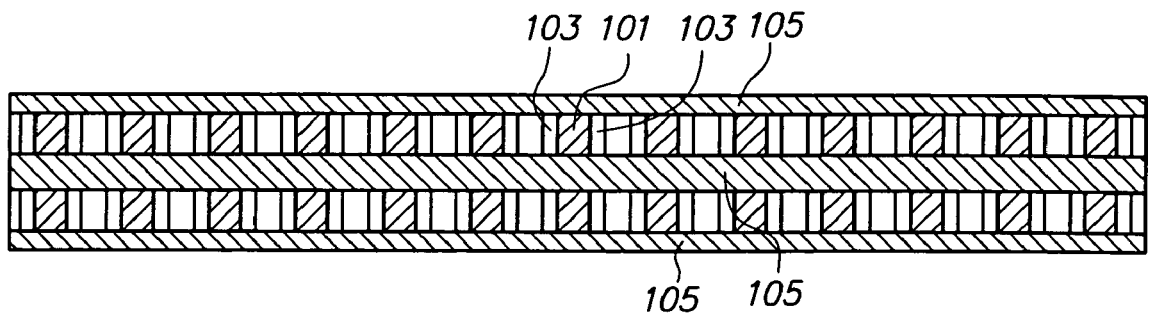
Figure 5:
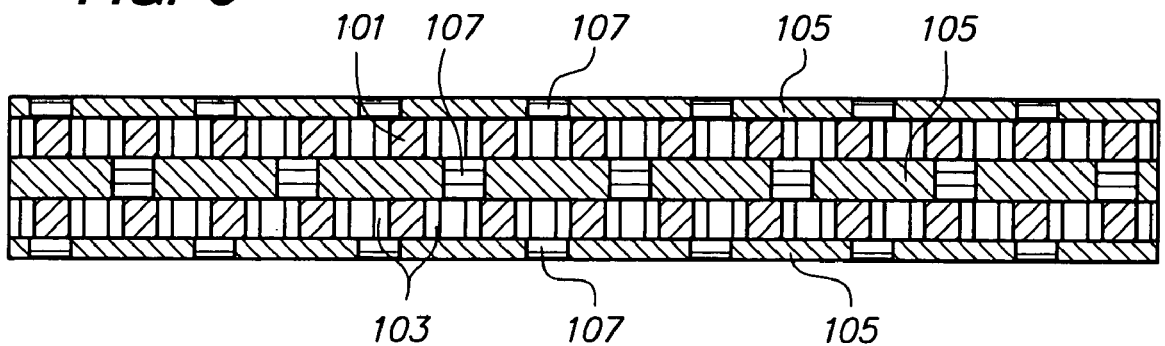
Figure 6:
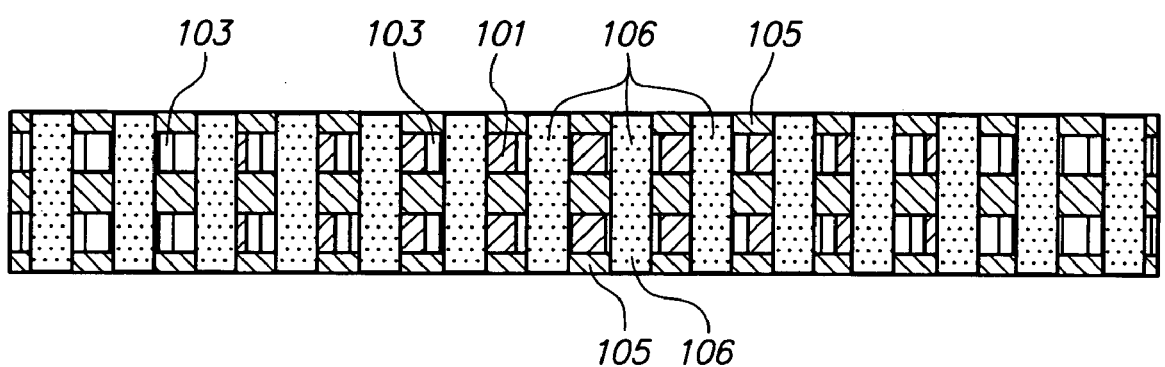
Figure 7:
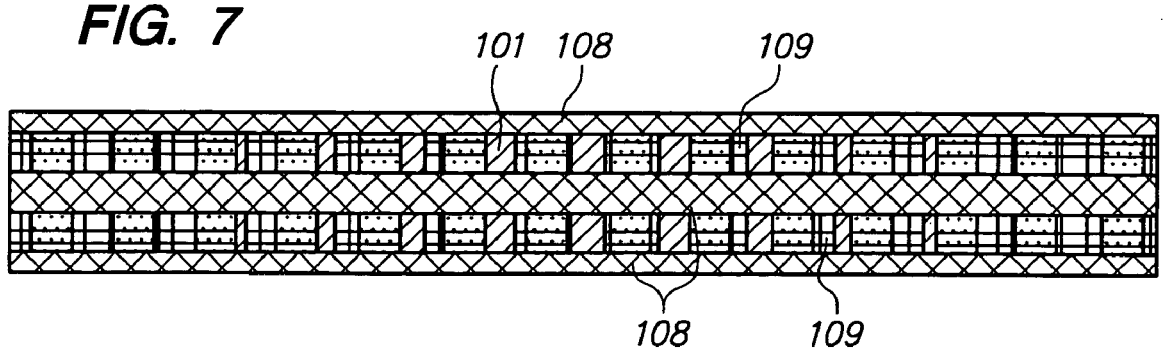

FIGS. 2–7 schematically show sectional top views of the integrated circuit structure of FIG. 1. FIG. 2 shows the polysilicon lines 101 between nitride spacers 103. FIG. 3 shows the portions of the LITR structures 105 that make it to the diffusion between the nitride spacers 103. FIG. 4 shows the portions of the LITR structures 105 above the top of the gate nitride 104. FIG. 5 shows the DDLICON lines 107 above the LITR structures 105. FIG. 6 shows the layout of the DDLI lines 106. FIG. 7 shows the M1 lines 108 and voids 109 (see also FIG. 8) between the M1 lines 108. Voids 109 are unintentional artifacts of the process, and are preferably eliminated if possible.

Figure 10:
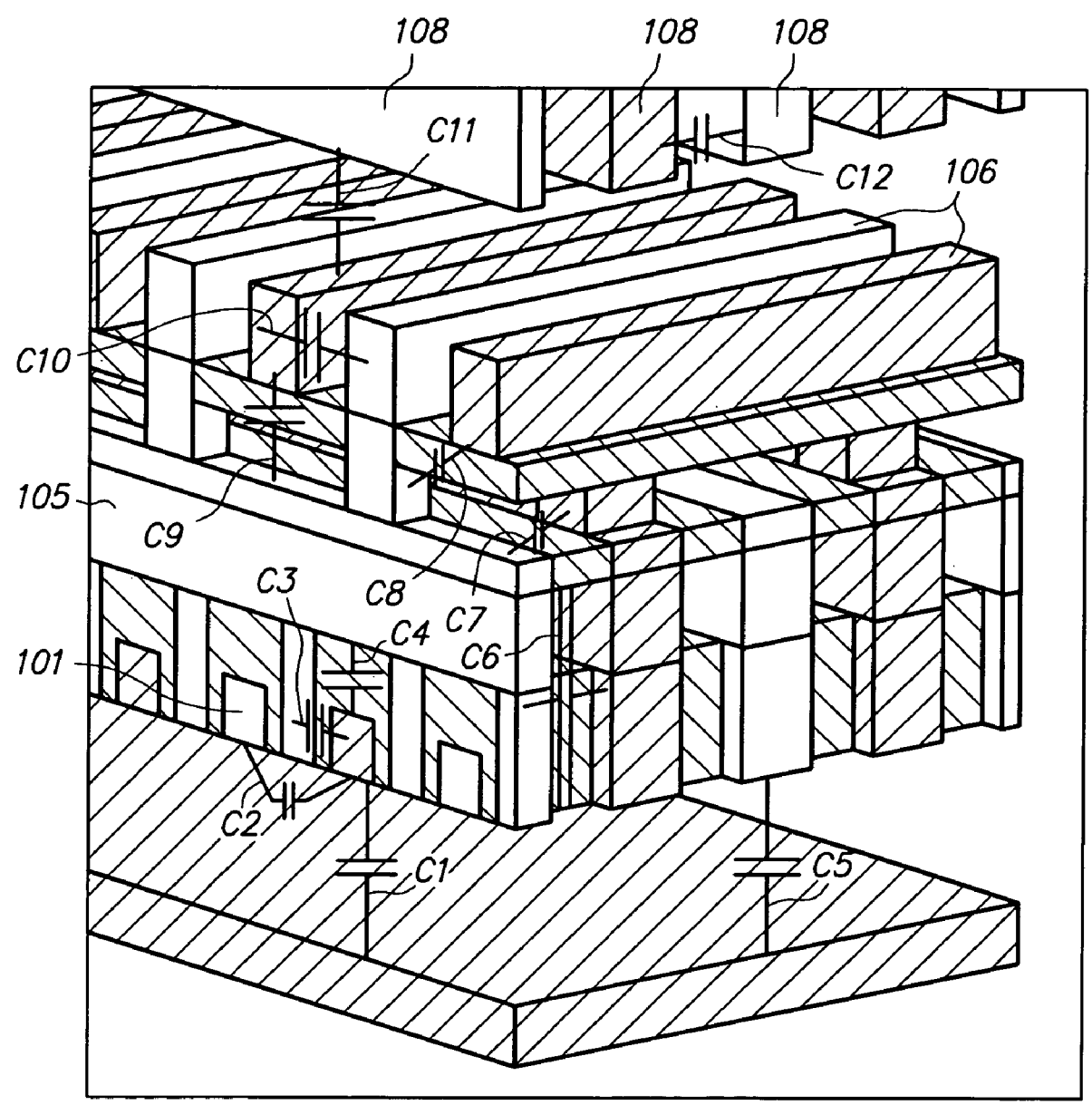
FIG. 10, which shows a closer view of FIG. 9, schematically shows various capacitors that may be formed in accordance with an embodiment of the present invention.

In the example of FIG. 1, capacitors may be formed between an LITR structure 105 and a polysilicon line 101 through a gate nitride 104 (i.e., vertical direction in FIG. 1) (e.g., see capacitor C4 in FIG. 10), between an LITR structure 105 and a polysilicon line 101 through a spacer nitride 103 (i.e., horizontal direction in FIG. 1) (e.g., see capacitor C3 in FIG. 10), and between LITR structures 105 (e.g., see capacitor C6 in FIG. 10). There could be also capacitance between LITR structures 105 and the substrate (see LITR structures 105 and substrate 801 in FIG. 8), through isolation layer 102.

The structure shown in FIG. 1 provides advantages heretofore unrealized. For example, the LITR structures 105 allow for capacitors that have a relatively large capacitance per unit area (e.g., on the order of $fF/\mu m^2$), are voltage independent, and have tight capacitance value control. Depending on the process, the use of the LITR structures 105 as part of integrated capacitors may also result in less processing steps and lower leakage current compared to conventional integrated capacitors. Because the LITR structures 105 may be relatively thick (e.g., about 5000 Angstroms thick) and may have tight spacing, relatively large coupling capacitance may be obtained. The structure of FIG. 1 does not substantially increase the stack height above the substrate, making the structure suitable for use in stack height-critical applications, such as image sensors for optical applications.

In the example of FIG. 1, the LITR structures 105 are routed above the polysilicon lines 101. Because the sides of the polysilicon lines 101 may have a relatively thin spacer 103 of silicon nitride (a high dielectric constant material), the routing of the LITR structures 105 above the polysilicon lines results in relatively large coupling capacitance between the LITR structures 105 and the polysilicon lines 101 (e.g., see capacitor C3 in FIG. 10). Each polysilicon lines 101 may be covered by a gate nitride 104, which may also be of a high dielectric constant material. This results in relatively large bottom capacitance between a polysilicon line 101 and an LITR structure 105 (e.g., see capacitor C4 in FIG. 10).

In the example of FIG. 1, LITR structures 105 and corresponding DDLI lines 106 are interdigitated in 3-dimensions (3D). For example, LITR structure 105-2 is interdigitated with LITR structures 105-1 and 105-3. Note that LITR structures 105-1 and 105-3 are connected by DDLI lines 106-1 and 106-3, while LITR structure 105-2 is connected to another LITR structure (not shown) by DDLI line 106-2. The perpendicular alignment of the LITR structures 105 over polysilicon lines 101 make the device less sensitive to variations in the critical dimensions of LITR structures 105, resulting in tighter capacitance. The alternate orientation of the layers (polysilicon lines 101 and DDLI lines 106 oriented one way, LITR structures 105 and M1 lines 108 oriented another way) results in extra capacitance between one layer and layers above and below it.

Figure 8:
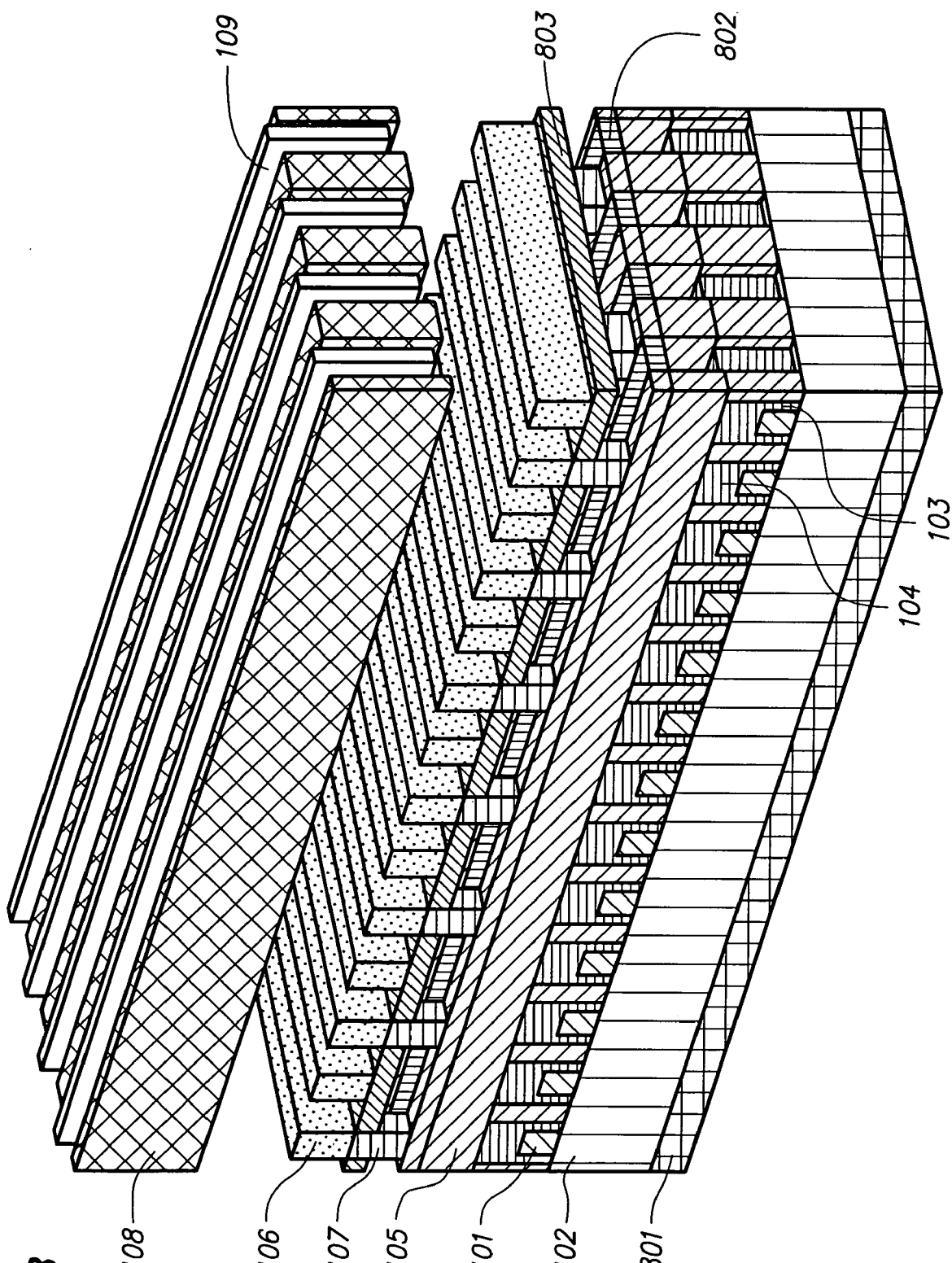
FIGS. 8 and 9 schematically illustrate an integrated circuit structure in accordance with an embodiment of the present invention.

FIG. 8 schematically illustrates an integrated circuit structure in accordance with an embodiment of the present invention. FIG. 8 shows the previously discussed polysilicon lines 101, nitride spacers 103 on the sidewalls of the polysilicon lines 101, gate nitrides 104 on top of the polysilicon lines 101, DDLICON lines 107, and isolation structure 102. FIG. 8 also shows a capping layer 802, which may comprise silicon nitride layer, between LITR structures 105, a dielectric layer 803 (e.g., silicon nitride) used to define the DDLICON lines 107, an interlayer dielectric containing voids 109 between M1 lines 108, and a substrate 801 (e.g., silicon substrate). Note that layers 802 and 803 are formed of high-k material to allow for relatively large capacitance.

Figure 9:
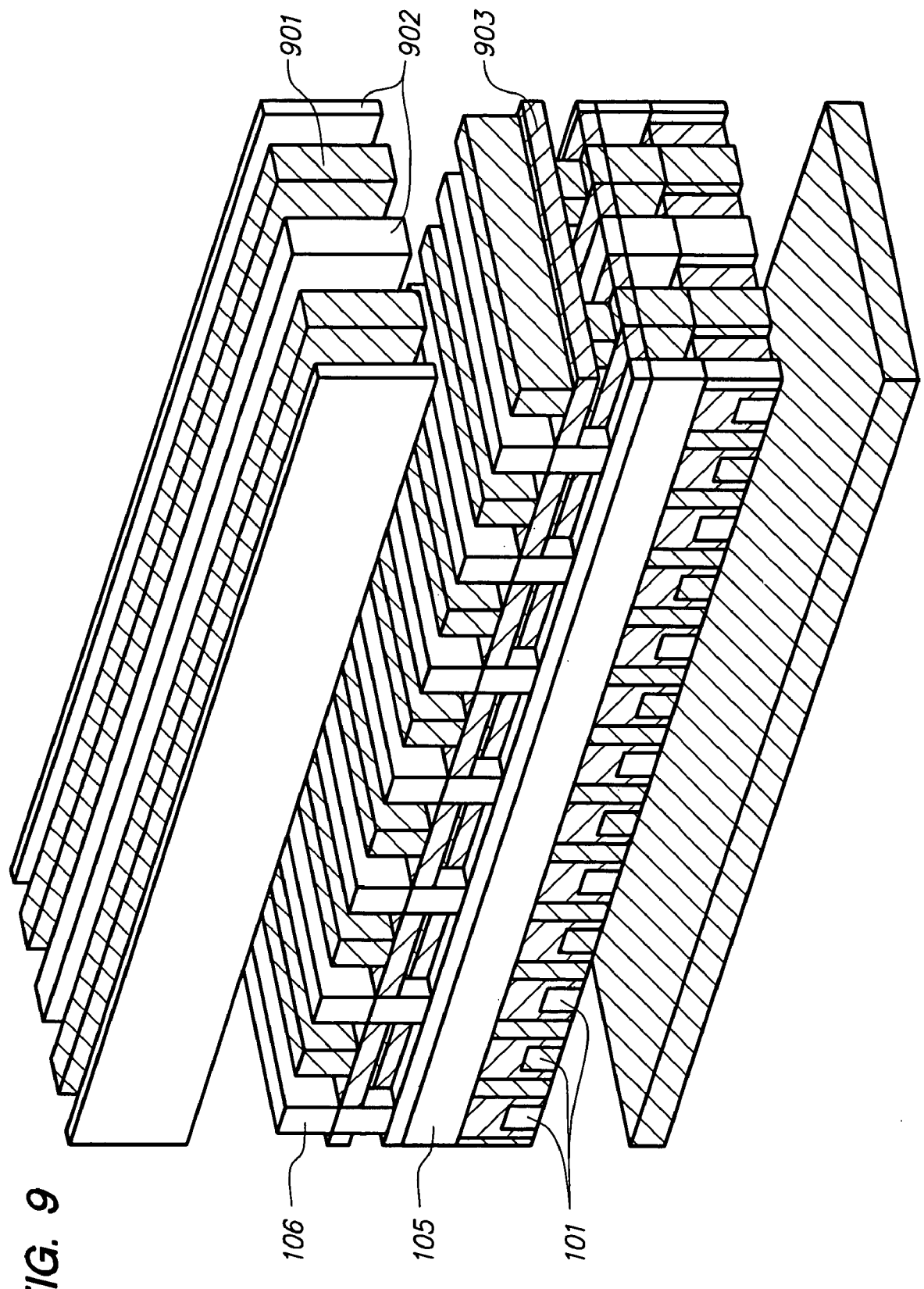

A capacitor may have a positive end and a negative end. FIG. 9 shows the structure of FIG. 8 with the features serving as a "positive end" depicted as having the cross-hatch labeled as 902, and the features serving as a "negative end" depicted as having the cross-hatch labeled as 901. It should be understood, however, that there is no set positive or negative end for the capacitors. For example, features 902 may serve as negative ends and features 901 may serve as positive ends depending on implementation.

FIG. 10, which shows a closer view of FIG. 9, schematically shows the various capacitors that may be formed in accordance with an embodiment of the present invention. In the example of FIG. 10, features cross-hatched as 902 and those cross-hatched as 901 and 903 form interdigitated capacitors. These interdigitated capacitors allow for utilization of the large coupling capacitance between the LITR structures 105, DDLI lines 106, and M1 lines 108, and large bottom capacitance from the top and bottom of the LITR structures 105 to polysilicon lines 101 capacitors (e.g., capacitors C3 and C4), DDLI lines 106 to LITR structures 105 capacitors (e.g., capacitor C7), and M1 lines 108 to DDLI lines 106 capacitors (e.g., capacitor C11). The alternating orientation of layers (e.g., the polysilicon lines 101 oriented one way, the LITR structures 105 across the polysilicon lines 101, the DDLI lines 106 across the LITR structures 105, the M1 lines 108 across the DDLI lines 106) results in additional capacitance between one layer and layers above and below it.

The DDLI lines 106, which may be formed using a dual-damascene process, may have relatively narrow line-to-line spacing. The use of the damascene process prevents void formation in the narrow space between DDLI lines 106, thus advantageously increasing coupling capacitance between the DDL Lines 106 (e.g., capacitor C10). Utilizing the coupling capacitance between the polysilicon lines 101 (e.g., capacitor C2), which may be surrounded by high dielectric constant silicon nitrides (e.g., gate nitride 104 and spacer 103), allows for large value capacitors. The perpendicular arrangement of the LITR structures 105 over the polysilicon lines 101 makes the integrated circuit device less sensitive to variations in the critical dimensions of the LITR structures 105. Utilizing a high dielectric constant silicon nitride around the top of the LITR structures 105 and the bottom of the DDLI lines 106 (e.g., see 802 and 803 in FIG. 8) also helps increase coupling capacitance.

As can be appreciated, the aforementioned capacitors may be designed into an integrated circuit for use in circuitry requiring capacitors. For example, the aforementioned capacitors may be coupled to an electrical circuit as a component of a low pass loop filter of a phase lock loop circuit. The aforementioned capacitors may also be employed in ESD (Electrostatic Discharge) trigger circuits, analog to digital converters (ADC) for image sensors, and other circuits.

FIGS. 11–24 schematically illustrate the fabrication of an integrated circuit structure in accordance with an embodiment of the present invention.

Figure 11:
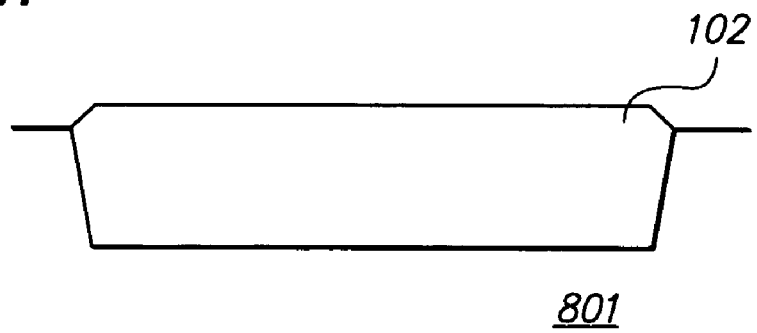
FIGS. 11–24 schematically illustrate the fabrication of an integrated circuit structure in accordance with an embodiment of the present invention.

In FIG. 11, an isolation structure 102 is formed in a substrate 801. The isolation structure 102 may comprise silicon dioxide and the substrate 801 may comprise silicon.

Figure 12:
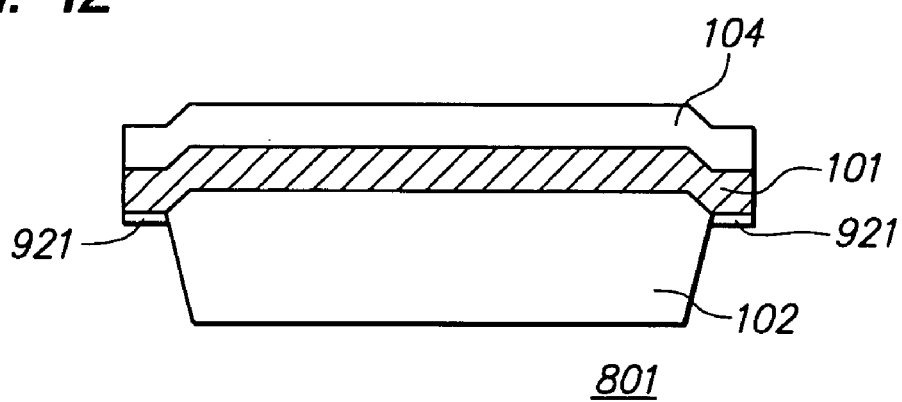

In FIG. 12, a gate oxide layer 921 is grown on isolation structure 102. A layer of polysilicon is then deposited over the gate oxide layer 921. The layer of polysilicon is labeled as "101" because it will be subsequently etched to form polysilicon lines 101 (see also FIG. 1). A dielectric layer comprising silicon nitride is subsequently formed over the layer polysilicon. The layer of silicon nitride is labeled as "104" because it will be subsequently etched to form gate nitrides 104 (see also FIG. 1).

Figure 13:
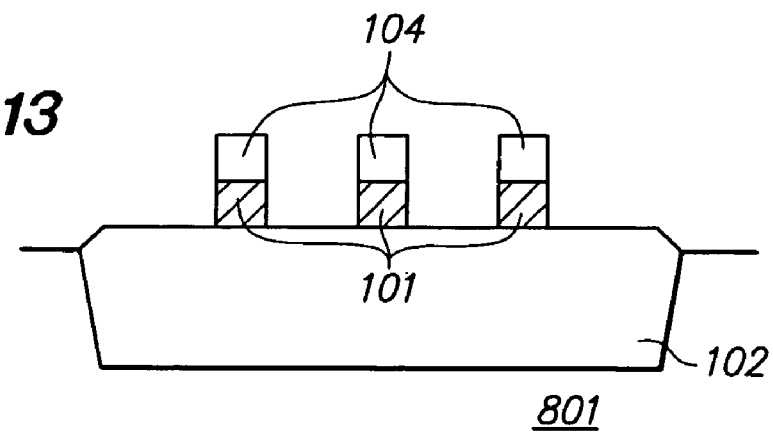

In FIG. 13, the layers of silicon nitride and polysilicon are etched to form gate nitrides 104 and polysilicon lines 101, respectively.

Figure 14:
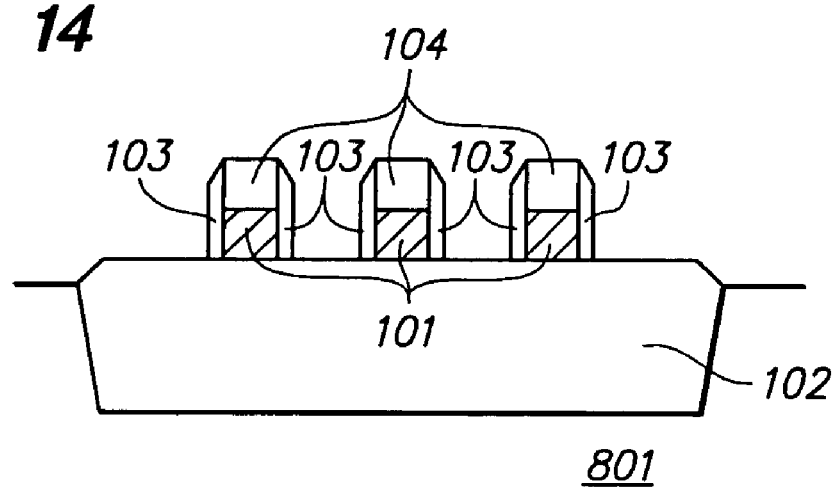

In FIG. 14, spacers 103 are formed on the sidewalls of polysilicon lines 101. Spacers 103 may comprise silicon nitride.

Figure 15:
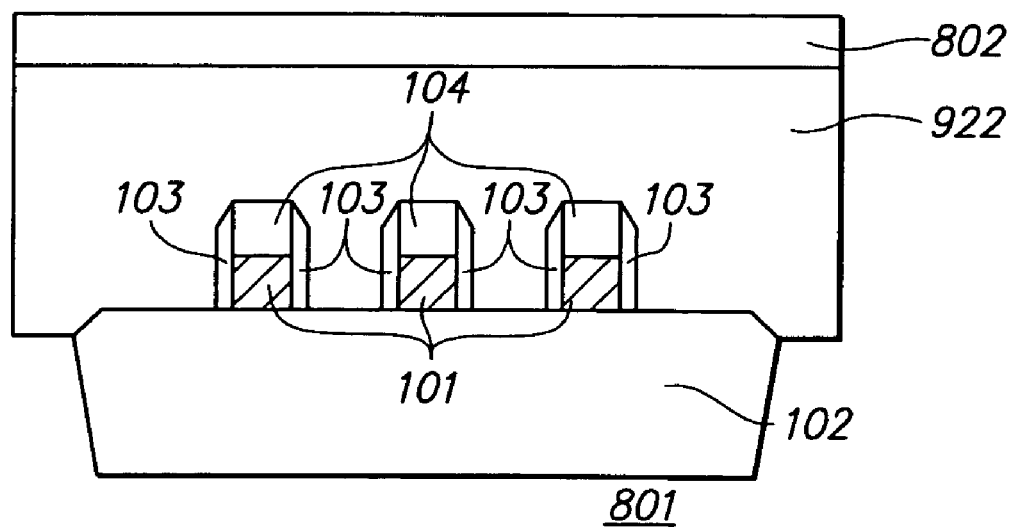

In FIG. 15, a dielectric 922 is deposited between the gate stacks comprising polysilicon lines 101 and gate nitrides 104. The dielectric 922 may comprise phosphosilicate glass (PSG). Dielectric 922 is polished before a capping layer 802 is deposited thereon. Capping layer 802 may comprise silicon nitride.

Figure 16:
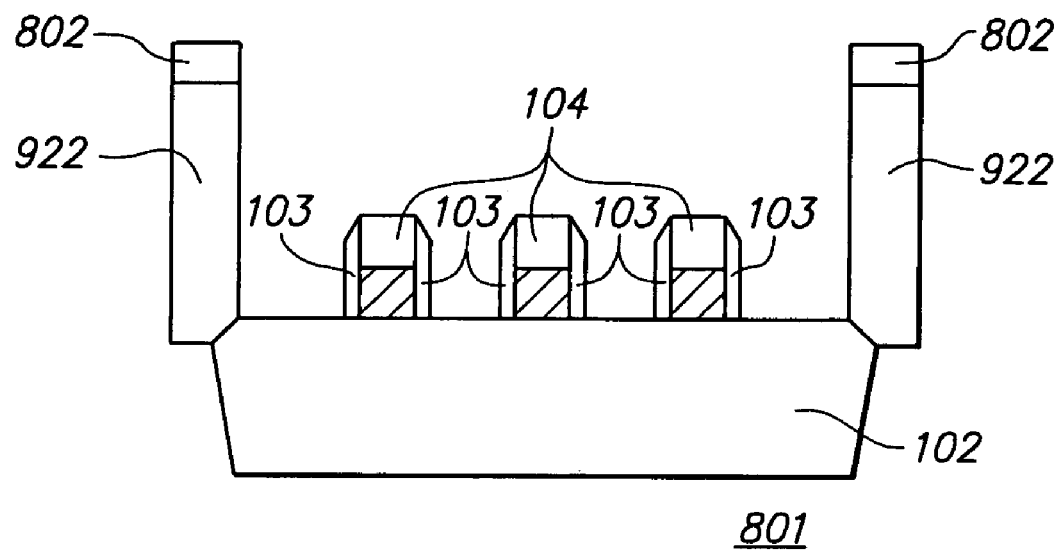

In FIG. 16, portions of dielectric 922 and capping layer 802 are etched to dig a trench for a local interconnect trench (LITR) structure.

Figure 17:
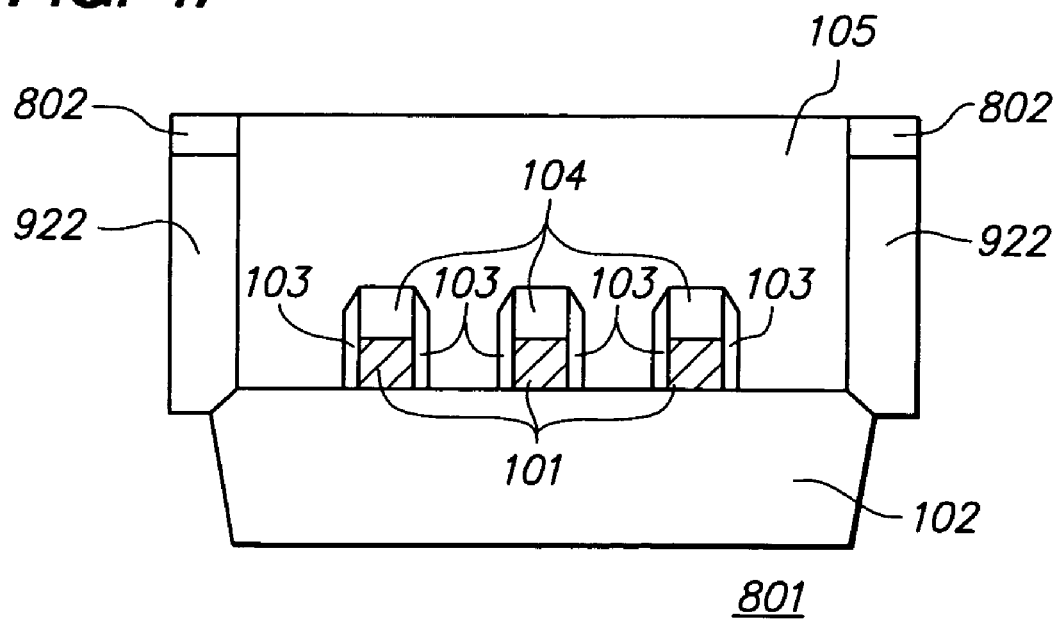

In FIG. 17, a conductive material is deposited into the trench and over the gate stack. The conductive material, which may comprise tungsten, is then polished. The conductive material is labeled as "105" because it forms an LITR structure 165 (see also FIG. 1) across the gate stack. As can be appreciated, one or more LITR structures 105 may be formed at the same time.

Figure 18:
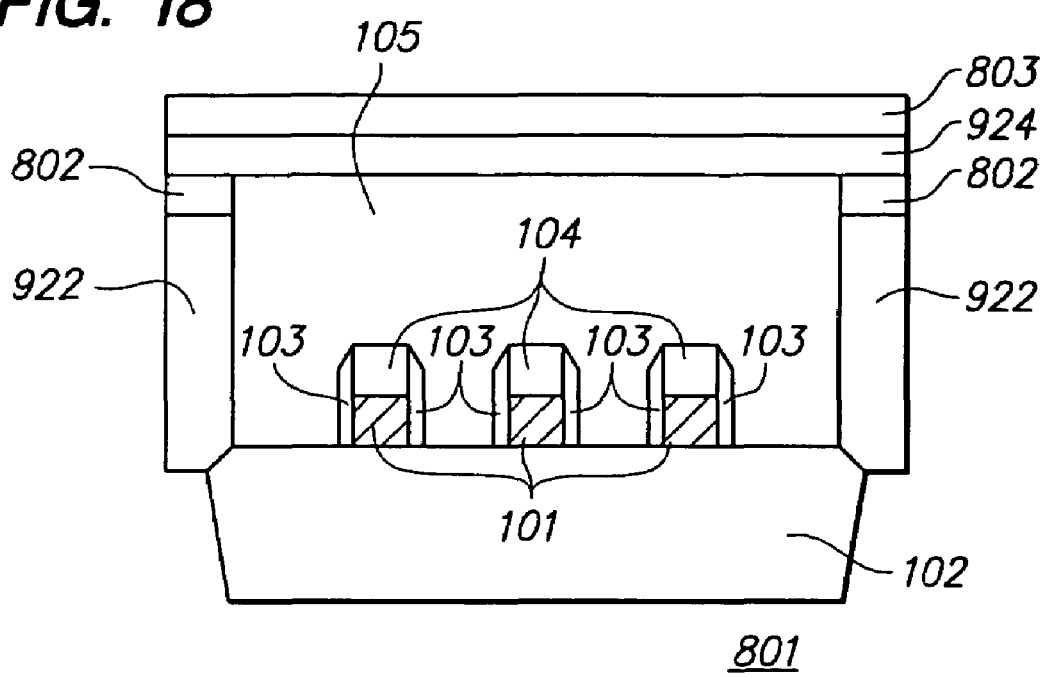

In FIG. 18, a dielectric layer 924 is deposited over the sample of FIG. 17. Dielectric layer 924, which serves as a local interconnect oxide, may comprise silicon dioxide. A dielectric layer 803 (see also FIG. 8) is deposited over dielectric layer 924. Dielectric layer 803 may comprise silicon nitride.

Figure 19:
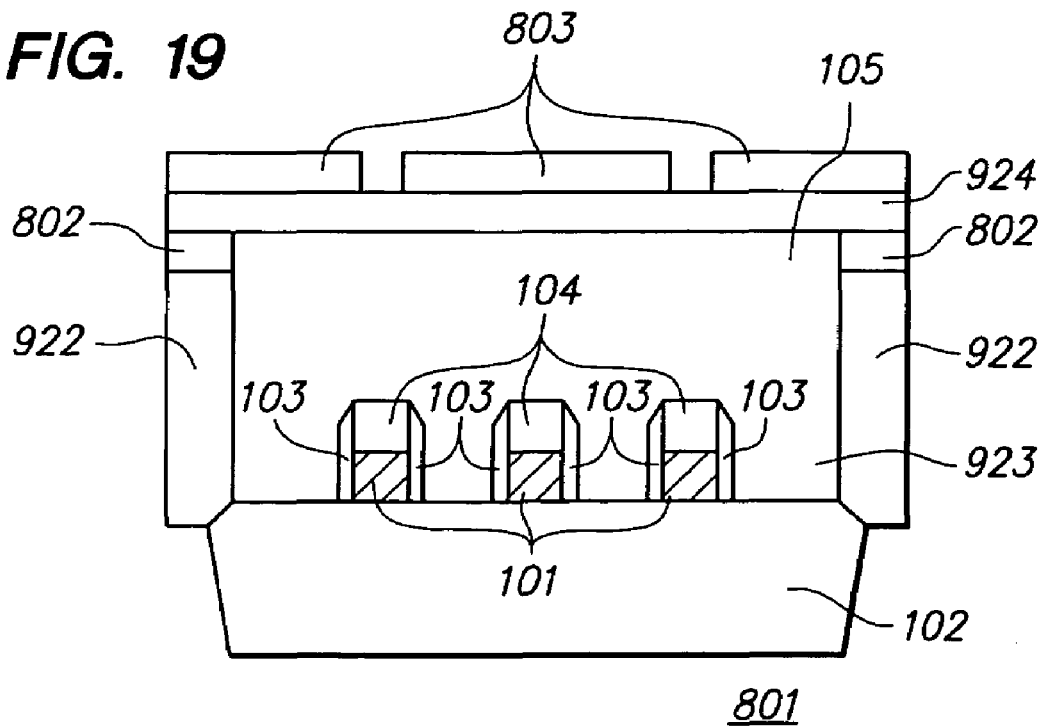

In FIG. 19, dielectric layer 803 is etched.

Figure 20:
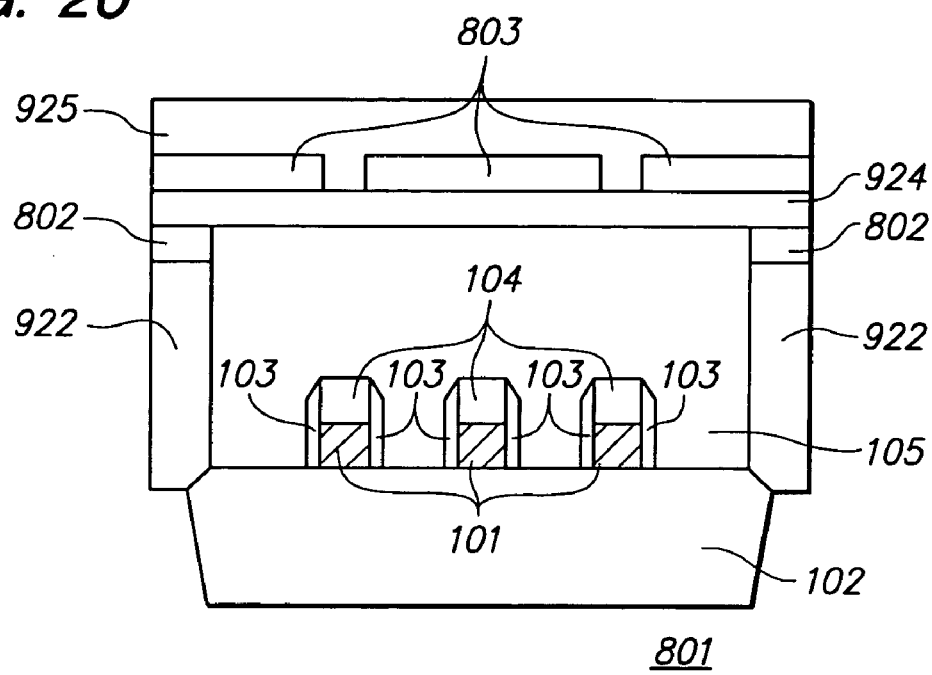

In FIG. 20, a dielectric layer 925 is deposited over the sample of FIG. 19. Dielectric layer 925, which serves as a local interconnect oxide, may comprise silicon dioxide.

Figure 21:
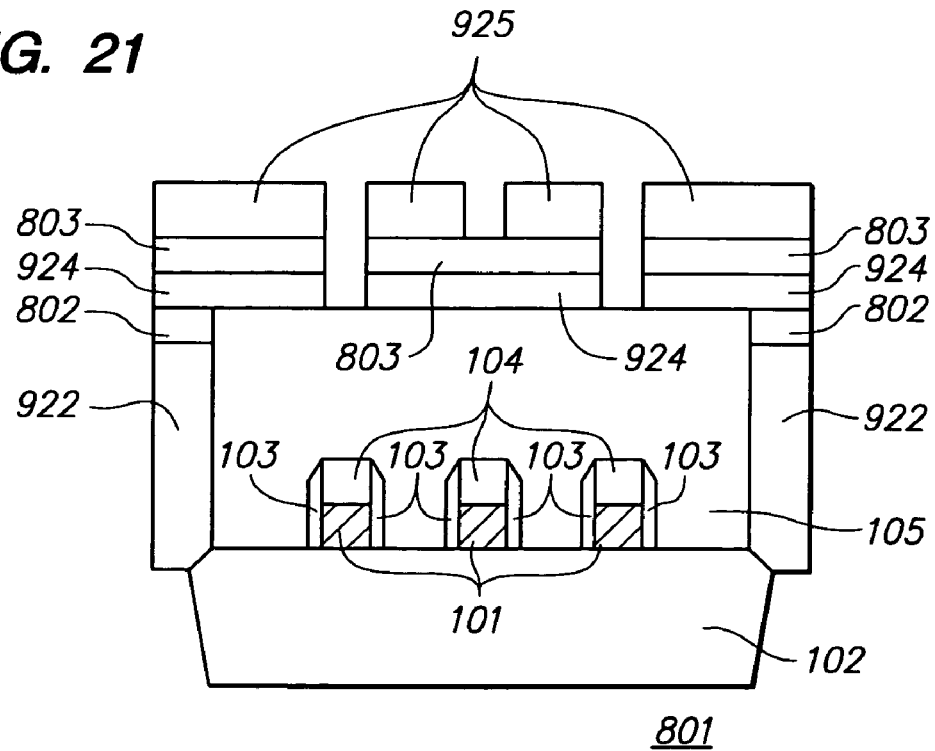

In FIG. 21, dielectric layers 925 and 924 are etched.

Figure 22:
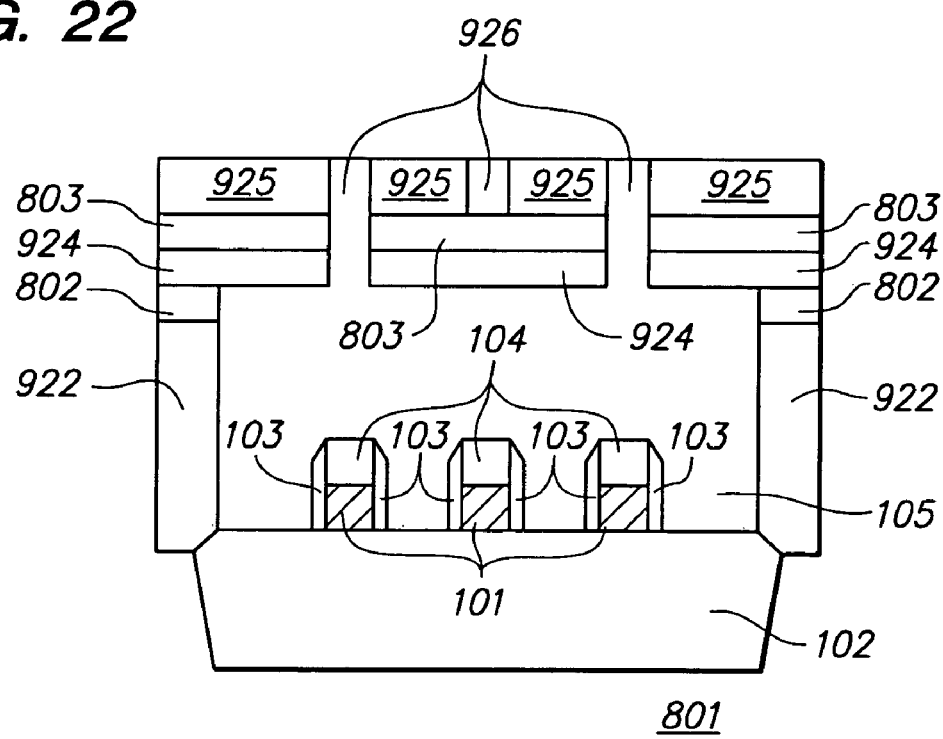

In FIG. 22, a conductive material 926 is deposited over the sample of FIG. 21. Conductive material 926 fills etched portions of dielectric layer 925 to form DDLI lines 106 and etched portions of dielectric layers 924 and 803 to form DDLICON lines 107. Conductive material 926, which may comprise tungsten, is then polished. The polishing process may gouge slightly into dielectric layer 925. In the example of FIG. 22, the deposition of conductive material 926 forms DDLI lines 106 (see FIG. 1) parallel to polysilicon lines 101 and approximately on the same level as dielectric 925, and forms DDLICON lines 107 (see FIG. 1). DDLICON lines 107 serve as contacts connecting DDLI lines 106 to LITR structures 105.

Figure 23:
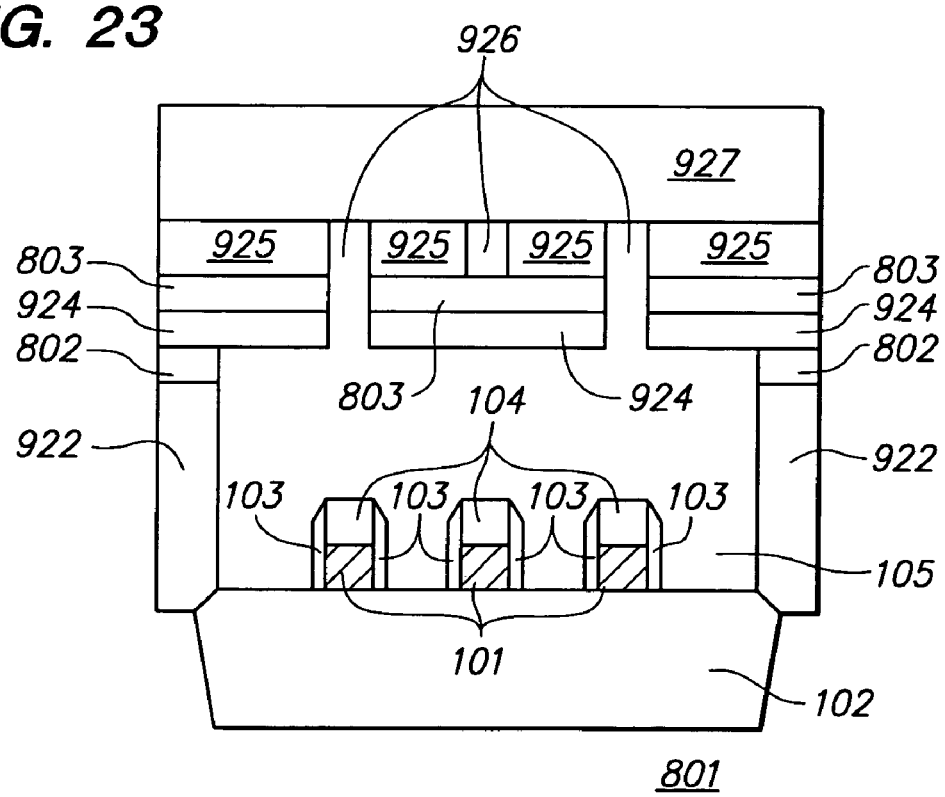

In FIG. 23, a dielectric layer 927 is deposited over the sample of FIG. 22. Dielectric layer 927 may comprise silicon dioxide.

Figure 24:
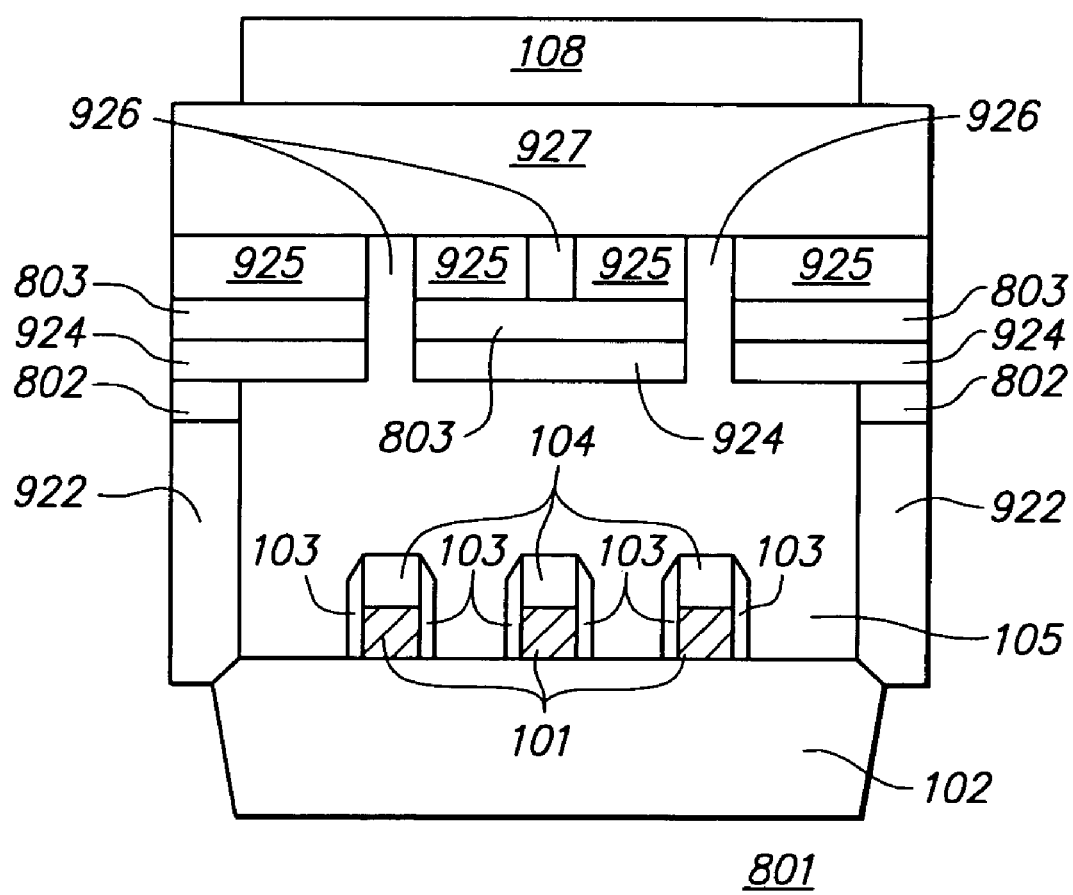

In FIG. 24, M1 lines 108 (see FIG. 1) are formed over dielectric layer 927. Note that electrically conductive metal connections (mcons; not shown) connecting M1 lines 108 to DDLI lines 106 may be formed before M1 lines 108.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. An integrated circuit structure comprising:
   a plurality of electrically conductive lines over a substrate;
   a plurality of electrically conductive trenches over the plurality of electrically conductive lines, each of the plurality of electrically conductive trenches spanning and filling a space between at least two electrically conductive lines in the plurality of electrically conductive lines; and
   a capacitor designed for use as a component of an electrical circuit, the capacitor formed using at least a first electrically conductive trench in the plurality of electrically conductive trenches.

2. The integrated circuit structure of claim 1 wherein the capacitor is formed by the first electrically conductive trench, a sidewall of a first electrically conductive line in the plurality of electrically conductive lines, and a dielectric between the first electrically conductive trench and the sidewall of the first electrically conductive line.

3. The integrated circuit structure of claim 1 wherein the capacitor is formed by the first electrically conductive trench, a top portion of a first electrically conductive line in the plurality of electrically conductive lines, and a dielectric between the first electrically conductive trench and the top portion of the first electrically conductive line.

4. The integrated circuit structure of claim 1 wherein the capacitor is formed by the first electrically conductive trench, a second electrically conductive trench in the plurality of electrically conductive trenches, and a dielectric between the first electrically conductive trench and the second electrically conductive trench.

5. The integrated circuit structure of claim 1 wherein the plurality of electrically conductive trenches is across the plurality of electrically conductive lines.

6. The integrated circuit structure of claim 1 wherein the electrically conductive trenches comprise tungsten.

7. The integrated circuit structure of claim 1 further comprising spacers formed on sidewalls of the electrically conductive lines.

8. The integrated circuit structure of claim 1 further comprising:
   a plurality of local interconnect lines formed over and across the plurality of electrically conductive trenches.

9. The integrated circuit structure of claim 8 wherein the capacitor is formed by a first local interconnect line in the plurality of local interconnect lines, the first electrically conductive trench, and a dielectric between the first local interconnect line and the first electrically conductive trench.

10. The integrated circuit structure of claim 8 further comprising a plurality of first level interconnect lines formed over and across the plurality of local interconnect lines.

* * * * *